(12) United States Patent
Morita et al.

(10) Patent No.: US 8,004,011 B2
(45) Date of Patent: Aug. 23, 2011

(54) FIELD EFFECT TRANSISTOR

(75) Inventors: Tatsuo Morita, Kyoto (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/805,135

(22) Filed: Jul. 14, 2010

(65) Prior Publication Data

US 2010/0283060 A1    Nov. 11, 2010

Related U.S. Application Data

(62) Division of application No. 11/603,224, filed on Nov. 22, 2006, now abandoned.

(30) Foreign Application Priority Data

Nov. 25, 2005  (JP) ................................ 2005-339544

(51) Int. Cl.
H01L 29/80 (2006.01)
(52) U.S. Cl. .................... 257/192; 257/76; 257/E29.315
(58) Field of Classification Search .................... 257/20, 257/192, 24, 103, 200, 204, 194, 195, 73, 257/76, 187, 189, 196, E29.246–254, E29.091, 257/E29.315
See application file for complete search history.

(56) References Cited

U.S. PATENT DOCUMENTS

| | | | |
|---|---|---|---|
| 4,945,393 A | 7/1990 | Beltram et al. | |
| 5,144,379 A * | 9/1992 | Eshita et al. | 257/194 |
| 5,362,678 A * | 11/1994 | Komaru et al. | 438/167 |
| 6,605,519 B2 | 8/2003 | Lishan | |
| 7,194,173 B2 | 3/2007 | Shtein et al. | |
| 2003/0213975 A1 | 11/2003 | Hirose et al. | |
| 2005/0001235 A1 | 1/2005 | Murata et al. | |
| 2005/0140274 A1 | 6/2005 | Lee et al. | |
| 2005/0151195 A1 | 7/2005 | Kawase et al. | |
| 2005/0189561 A1* | 9/2005 | Kinzer et al. | 257/192 |
| 2005/0274977 A1 | 12/2005 | Saito et al. | |
| 2006/0019435 A1* | 1/2006 | Sheppard et al. | 438/167 |
| 2006/0065911 A1* | 3/2006 | Twynam | 257/192 |
| 2006/0097261 A1 | 5/2006 | Yang | |
| 2006/0108602 A1* | 5/2006 | Tanimoto | 257/192 |
| 2007/0103055 A1 | 5/2007 | Tomai et al. | |

FOREIGN PATENT DOCUMENTS

JP  2003-320071 A  11/2003
WO  WO 03/019598 A1  3/2003

OTHER PUBLICATIONS

Cui, et al., "Indium Tin Oxide Alternatives-High Work Function Transparent Conducting Oxides as Anodes for Organic Light-Emitting Diodes," *Advanced Materials* (2001), pp. 1476-1479, vol. 13, Wiley-Vch,Verlag GmbH, Weinheim, Germany.

Jiang, et al., "Aluminum-Doped Zinc Oxide Films as Transparent Conductive Electrode for Organic Light-Emitting Devices," *Applied Physics Letters* (2003), pp. 1875-1877, vol. 83, American Institute of Physics.

* cited by examiner

*Primary Examiner* — Evan Pert
*Assistant Examiner* — Selim Ahmed
(74) *Attorney, Agent, or Firm* — Steptoe & Johnson LLP

(57) ABSTRACT

A material of a gate electrode is a conductive oxide having a higher work function than that of conventionally used Pd and so on, thereby achieving a normally-off transistor without reducing the sheet carrier concentration of a heterojunction. It is thus possible to achieve a normally-off operation while reducing an increase in the specific on-state resistance.

11 Claims, 8 Drawing Sheets

FIELD EFFECT TRANSISTOR

CROSS-REFERENCE TO RELATED APPLICATIONS

This application is a divisional of parent application Ser. No. 11/603,224, filed Nov. 22, 2006 which claims the priority of Japanese Patent Application No. 2005-339544, filed Nov. 25, 2005. The priority of both of those prior applications is claimed for this divisional application.

FIELD OF THE INVENTION

The present invention relates to a field effect transistor using a nitride semiconductor, which is applicable to a power switching device for use in the power supply circuit of a consumer appliance.

BACKGROUND OF THE INVENTION

GaN semiconductor is promising for the material of future high power switching devices owing to its high saturation velocity and breakdown electric field. So far, AlGaN/GaN hetero-junction field effect transistor (HFETs) have been demonstrated with both a low specific on-state resistance and high breakdown voltage taking advantage of inherent high sheet carrier density at the hetro-interface caused by built-in polarization field. Further, as substrate materials, GaN wide-gap semiconductor materials can be grown on Si substrates that can be increased in area with a high thermal conductivity and low cost, as well as conventionally used sapphire and SiC substrates. Thus GaN semiconductor has a number of advantages to power devices.

Referring to FIG. 8, the following will describe an example of a reported field effect transistor using a nitride semiconductor.

FIG. 8 is a sectional view showing the structure of the conventional field effect transistor using a GaN semiconductor.

In FIG. 8, reference numeral 801 denotes a SiC substrate, reference numeral 802 denotes an AlN buffer layer, reference numeral 803 denotes a first undoped GaN layer, reference numeral 804 denotes a first AlGaN layer, reference numeral 805 denotes a Ti/Al drain electrode, reference numeral 806 denotes a protective film, reference numeral 807 denotes a Ni/Au gate electrode, and reference numeral 808 denotes a Ti/Al source electrode. In this structure, the AlN buffer layer 802, the first undoped GaN layer 803, and the first AlGaN layer 804 are formed in this order on the SiC substrate 801, the Ti/Al source electrode 808, the Ti/Al drain electrode 805, and the Ni/Au gate electrode 807 are formed on the first AlGaN layer 804, the protective film 806 made of $SiO_2$ and SiN is formed so as to cover the Ni/Au gate electrode 807, the Ti/Al drain electrode 805, and a part of the Ti/Al source electrode 808, and a part of the Ti/Al source electrode 808 penetrates the protective film 806 and is exposed on the protective film 806. With this structure, it is possible to achieve a field effect transistor having a breakdown voltage of 600 V, a current density of 850 A/cm$^2$ between the source and drain, and a specific on-state resistance (RonA) of 3.3 mΩcm$^2$.

However, as a device for power control, normally off operation is demanded which interrupts current between the source and drain at a gate voltage of 0 V as in Si power MOS transistors. The conventional AlGaN/GaN HFET on the SiC substrate performs a normally-on operation that passes current between the source and drain at the gate voltage of 0 V.

When the normally-on type device is applied to the device of power control circuit, the circuit may be broken due to short-circuit. Thus normally-off type having a positive threshold voltage is strongly required.

In order to achieve a normally-off operation having a positive threshold voltage, it is necessary to reduce the sheet carrier concentration of electrons in a channel. However, in this case, there is a problem that the specific on-state resistance is increased.

DISCLOSURE OF THE INVENTION

In view of the foregoing technical problem, an object of the present invention is to provide a field effect transistor that achieves a normally-off operation by using a conductive oxide having a higher work function for a gate electrode and outputs a large current with a low specific on-state resistance.

In order to attain the object, the field effect transistor of the present invention uses a conductive oxide for a gate electrode.

A threshold voltage is higher than 0 V.

The conductive oxide used for the gate electrode has a work function of at least 5.6 eV.

The conductive oxide is composed of indium tin oxide containing one of Zn and Ga.

An insulating film is formed so as to have an opening on a semiconductor layer being in contact with the gate electrode, and the gate electrode is formed so as to cover the opening formed on the insulating film.

A recessed portion is formed on a surface of the semiconductor layer being in contact with the gate electrode, and the gate electrode is formed in contact with at least a part of a surface of the recessed portion.

The gate electrode is in contact with the surface of the semiconductor layer, and an interface between the gate electrode and the semiconductor layer lies above the surface of the semiconductor layer having no interface with the gate electrode.

The gate electrode is in contact with the surface of the semiconductor layer, and an oxide layer is formed on the side of the gate electrode. The oxide layer is obtained by oxidizing the surface of the semiconductor layer.

The semiconductor layer is made of a compound semiconductor containing nitrogen. The semiconductor layer is formed in contact with the gate electrode, a source electrode, and a drain electrode.

The gate electrode is in direct contact with the semiconductor layer.

The gate electrode is placed on the semiconductor layer via the insulating film.

The insulating film is a thermal oxide film made of one of $SiO_2$ and the compound semiconductor.

DESCRIPTION OF THE EMBODIMENTS

In a field effect transistor of the present invention, instead of conventionally used metals such as Pd (a work function of 5.1 eV), Pt (a work function of 5.6 eV), and Ni (a work function of 5.1 eV) having relatively high work functions, a conductive oxide such as ZnInSnO having a higher work function is used for a gate electrode. ZnInSnO has a work function of 6.1 eV (see Ji Cui et al, Advanced Materials. 13, No. 19, 1476 (2001)), which is higher than 5.6 eV of conventionally used Pt, thereby achieving a normally-off operation keeping high sheet carrier concentration Ns. For normally-off operation, the threshold voltage can be increased not only by a structure that reduces Ns, but also by increasing a work function $\Phi_M$ of the gate electrode.

Referring to the accompanying drawings, embodiments of the field effect transistor using ZnInSnO as the gate electrode will be described below.

Embodiment 1

Figure 1:
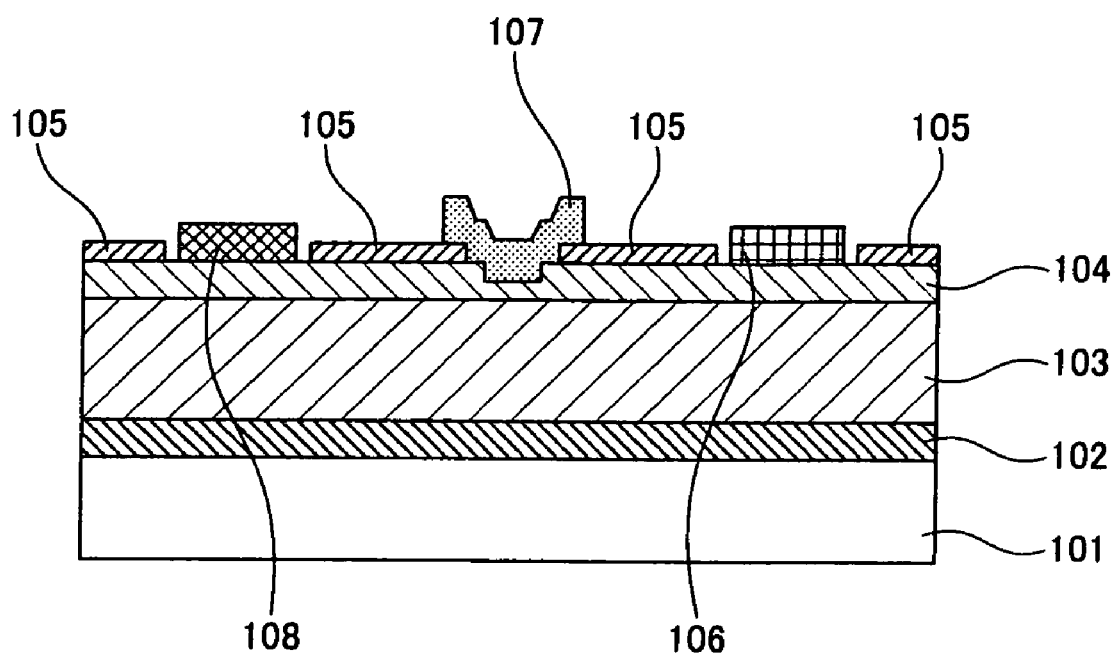
FIG. 1 is a sectional view showing a field effect transistor using a conductive oxide for a gate electrode according to Embodiment 1 of the present invention.

FIG. 1 is a sectional view showing a field effect transistor using a conductive oxide for a gate electrode according to Embodiment 1 of the present invention.

In FIG. 1, reference numeral 101 denotes a sapphire substrate, reference numeral 102 denotes an AlN buffer layer, reference numeral 103 denotes a first undoped GaN layer, reference numeral 104 denotes a first undoped AlGaN layer, reference numeral 105 denotes a $SiO_2$ thin film, reference numeral 106 denotes a Ti/Al drain electrode, reference numeral 107 denotes a ZnInSnO gate electrode, and reference numeral 108 denotes a Ti/Al source electrode.

FIG. 1 shows the configuration of the field effect transistor of so-called normally-off type according to Embodiment 1. A threshold voltage $V_P$ is larger than 0 V. The feature of this configuration is the use of ZnInSnO for the gate electrode. In this configuration, the AlN buffer layer 102 having a thickness of 0.5 μm, the first undoped GaN layer 103 having a thickness of 3 μm, and the first undoped AlGaN layer 104 having a composition of $Al_{0.25}Ga_{0.75}N$ with a thickness of 20 nm are formed in this order on a plane (0001) of the sapphire substrate 101. The first undoped AlGaN layer 104 is formed with a recessed portion and has a thickness of 12 nm in the recessed portion. Further, the first undoped AlGaN layer 104 may be an n-type AlGaN layer doped with Si. In this configuration, the composition ratio of the first undoped AlGaN layer 104 is $Al_{0.25}Ga_{0.75}N$, but the first undoped AlGaN layer 104 may be an undoped AlGaN and n-type AlGaN layer with any composition ratio as long as excellent transistor characteristics are obtained. In this case, the recessed portion of the first undoped AlGaN layer 104 has a thickness enabling a normally-off operation having a threshold voltage of 0 V or higher. On portions other than the recessed portion of the first undoped AlGaN layer 104, the Ti/Al source electrode 108 and the Ti/Al drain electrode 106 are formed in this order. These two electrodes are made of Ti having a thickness of 50 nm and Al having a thickness of 300 nm. The $SiO_2$ thin film 105 having a thickness of 400 nm is formed between these two electrodes. The $SiO_2$ thin film 105 has an opening that reaches the first undoped AlGaN layer 104 and is formed so as to open the recessed portion of the first undoped AlGaN layer 104. In this configuration, the $SiO_2$ thin film 105 is used, but instead, an insulating film made of a material including $SiN_x$, polyimide, and BCB (Benzocyclobutane) may be used. Further, the ZnInSnO gate electrode 107 having a thickness of 200 nm is formed in contact with the recessed portion of the first undoped AlGaN layer 104 and the $SiO_2$ thin film 105. Although the ZnInSnO gate electrode 107 is formed in contact with the entire recessed portion of the first undoped AlGaN layer 104 and the $SiO_2$ thin film 105, the ZnInSnO gate electrode 107 may be formed in contact only with the bottom side of the recessed portion of the first undoped AlGaN layer 104. Although ZnInSnO is used for the gate electrode, a material such as $La_{2-x}Sr_xCuO_4$ and yttrium barium copper oxygen (YBCO) may be used for the gate electrode. The field effect transistor described above has a recessed configuration. The first undoped AlGaN layer 104 may have a thickness enabling a threshold voltage of 0 V and the field effect transistor may have no recessed configuration as described in Background of the Invention. According to the field effect transistor of the present embodiment, ZnInSnO having a work function of 6.1 eV higher than that of conventionally used Ni is used for the gate electrode. Thus a normally-off type transistor can be obtained with a relatively high sheet carrier concentration on an AlGaN/GaN heterojunction, thereby achieving a field effect transistor with a low on resistance while keeping a normally-off operation.

The threshold voltage $V_P$ of the field effect transistor of FIG. 1 is expressed by the following Equation (1):

$$V_p = \frac{\phi_M - X_{AlGaN} - \Delta E_C}{q} - \frac{qN_S d_{AlGaN}}{\varepsilon_0 \varepsilon_{AlGaN}} \quad (1)$$

where $\Phi_M$ represents the work function of the gate electrode, $X_{AlGaN}$ represents the electron affinity of the first undoped AlGaN layer 104, $\Delta E_C$ represents the height of an energy barrier formed by the heterostructure of the first undoped AlGaN layer 104 and the first undoped GaN layer 103, $d_{AlGaN}$ represents the thickness of the first undoped AlGaN layer 104 immediately below the gate, q represents the charge of electrons, $\varepsilon_o$ represents an permittivity in vacuum, $\varepsilon_{AlGaN}$ represents the relative dielectric constant of the AlGaN layer, and Ns represents the sheet carrier concentration of electrons in a channel immediately below the gate electrode. According to Equation (1), $V_P$ changes with Ns, $\Phi_M$ and $d_{AlGaN}$. Although $V_P$ can be set at 0 V or higher by reducing Ns, the reduced Ns increases the specific on-state resistance.

Figure 2:
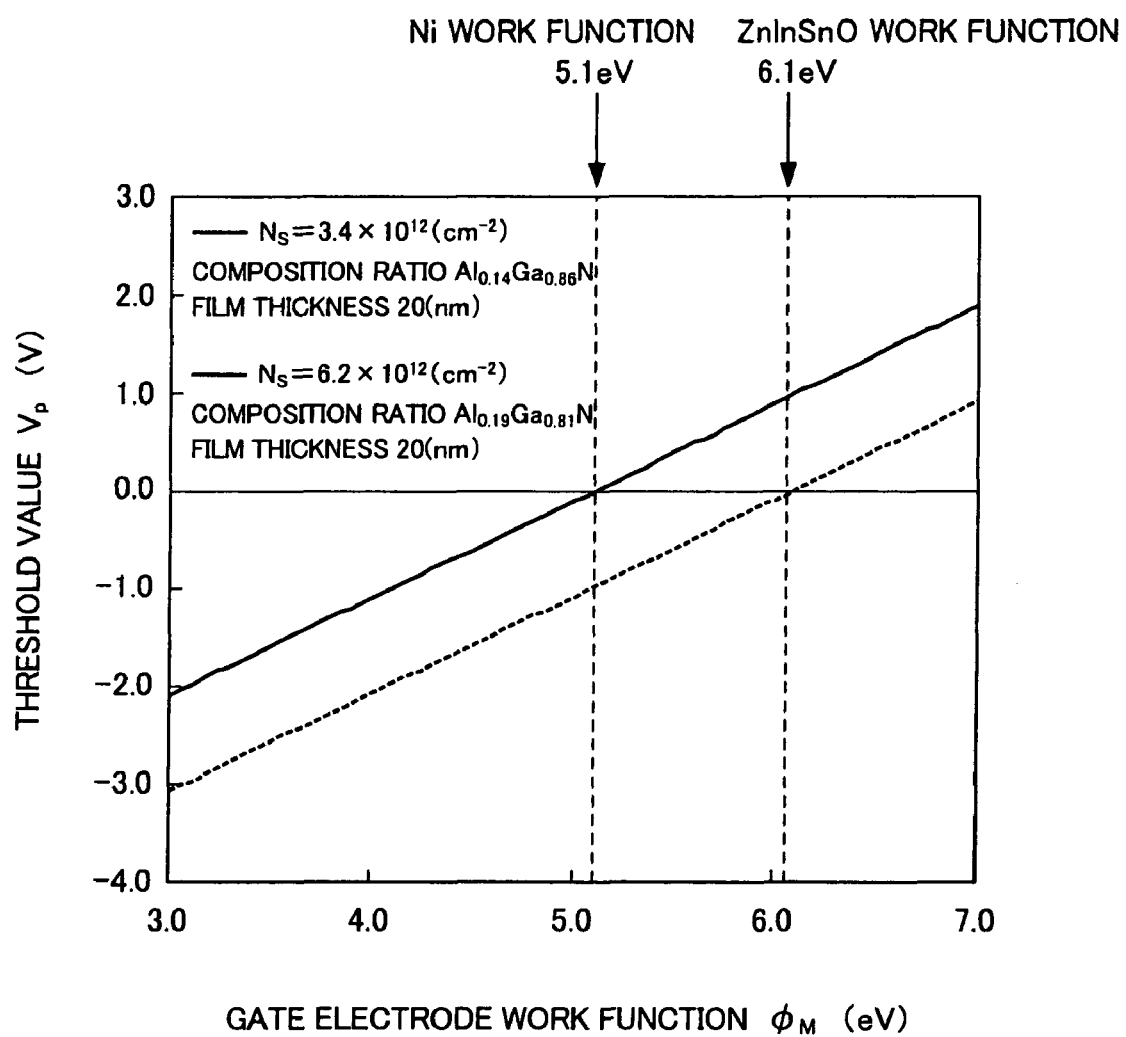
FIG. 2 is a graph showing the relationship between a work function of the gate electrode of the field effect transistor and a pinch-off voltage of the field effect transistor according to Embodiment 1.

FIG. 2 is a graph showing the relationship between a work function of the gate electrode of the field effect transistor and a pinch-off voltage of the field effect transistor according to Embodiment 1, that is, the relationship between $V_P$ and $\Phi_M$ of the field effect transistor having Ns of $3.4 \times 10^{12}$ (cm$^{-2}$) and $6.2 \times 10^{12}$ (cm$^{-2}$).

In the field effect transistor of Ns=$3.4 \times 10^{12}$ (cm$^{-2}$) of FIG. 2, the composition ratio of the first undoped AlGaN layer is $Al_{0.14}Ga_{0.86}N$, the thickness $d_{AlGaN}$ is 20 nm, $\varepsilon_{AlGaN}$ is 9.43, $\Delta E_C$ is 0.18 eV, and $X_{AlGaN}$ is 3.61 eV. In the field effect transistor of Ns=$6.2 \times 10^{12}$ (cm$^{-2}$), the composition ratio of the first undoped AlGaN layer is $Al_{0.19}Ga_{0.81}N$, the thickness $d_{AlGaN}$ is 20 nm, $\varepsilon_{AlGaN}$ is 9.41, $\Delta E_C$ is 0.25 eV, and $X_{AlGaN}$ is 3.44 eV.

According to FIG. 2, when conventionally used Ni (a work function of 5.1 eV) is used for the gate electrode, it is necessary to reduce Ns to $3.4 \times 10^{12}$ (cm$^{-2}$) to set $V_P$ at 0V or higher. Ns required for a normally-off operation having $V_P$ of 0 V or higher can be increased up to $6.2 \times 10^{12}$ (cm$^{-2}$) by using, for example, ZnInSnO having a high work function (6.1 eV), thereby suppressing the specific on-state resistance increased by the normally-off operation.

As is evident from FIG. 2, by using the conductive oxide for the gate electrode, a sheet carrier concentration required for a normally-off operation can be considerably increased from conventional $3.4 \times 10^{12}$ (cm$^{-2}$) to $6.2 \times 10^{12}$ (cm$^{-2}$), thereby reducing the specific on-state resistance.

The recessed configuration of the present embodiment makes it possible to increase the thickness of the AlGaN layer on the recessed portion required for a normally-off operation, so that a leakage current caused by a tunnel effect can be further reduced and a higher positive voltage can be applied to the gate. Therefore, it is possible to achieve a field effect transistor of normally-off type that outputs a large current with a low on resistance.

Referring to FIG. 3, the following will describe an example of the fabrication method of the field effect transistor shown in FIG. 1.

FIG. 3 is a process sectional view showing the fabrication method of the field effect transistor according to Embodiment 1 of the present invention.

In FIG. 3, reference numeral 301 denotes a sapphire substrate, reference numeral 302 denotes an AlN buffer layer, reference numeral 303 denotes a first undoped GaN layer, reference numeral 304 denotes a first undoped AlGaN layer, reference numeral 305 denotes a SiO$_2$ thin film, reference numeral 306 denotes a resist, reference numeral 307 denotes a Ti/Al source electrode, reference numeral 308 denotes a Ti/Al drain electrode, and reference numeral 309 denotes a ZnInSnO gate electrode.

Figure 3A:
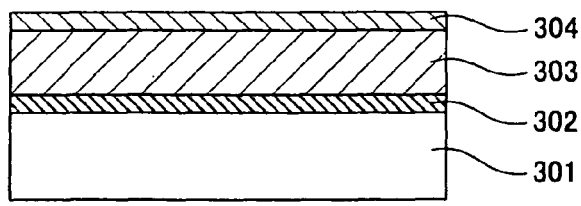
FIG. 3A is a process sectional view showing the fabrication method of the field effect transistor according to Embodiment 1 of the present invention.
Figure 3B:
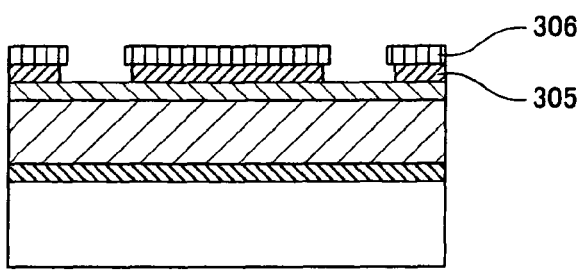
FIG. 3B is a process sectional view showing the fabrication method of the field effect transistor according to Embodiment 1 of the present invention.
Figure 3C:
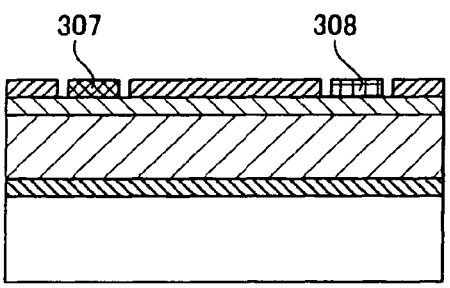
FIG. 3C is a process sectional view showing the fabrication method of the field effect transistor according to Embodiment 1 of the present invention.
Figure 3D:
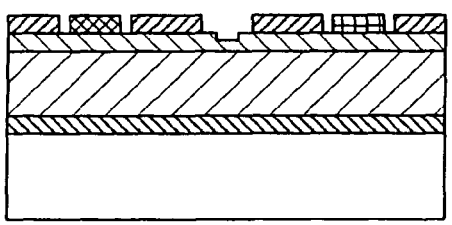
FIG. 3D is a process sectional view showing the fabrication method of the field effect transistor according to Embodiment 1 of the present invention.
Figure 3E:
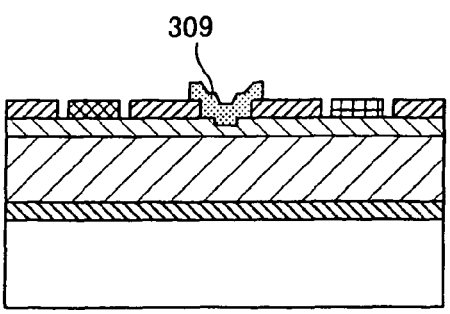
FIG. 3E is a process sectional view showing the fabrication method of the field effect transistor according to Embodiment 1 of the present invention.

In this configuration, the AlN buffer layer 302 having a thickness of 0.5 μm, the first undoped GaN layer 303 having a thickness of 3 μm, and the first undoped AlGaN layer 304 having a thickness of 25 nm are formed in this order on a plane (0001) of the sapphire substrate 301 by metal organic chemical vapor deposition (MOCVD) (FIG. 3A). The first undoped AlGaN layer 304 is formed with a composition of $Al_{0.25}Ga_{0.75}N$. After the epitaxial growth of FIG. 3A, the SiO$_2$ thin film 305 having a thickness of 400 nm is selectively formed on the first undoped AlGaN layer 304 (FIG. 3B). The SiO$_2$ thin film 305 is formed over the first undoped AlGaN layer 304 by, for example, chemical vapor deposition (CVD) using SiH$_4$ and O$_2$. In order to selectively remove the SiO$_2$ thin film 305, the formation areas of the drain electrode and the source electrode are selectively removed by a photolithography process using the resist 306 and wet etching using hydrofluoric acid. After the opening on the SiO$_2$ thin film 305 is formed, the Ti/Al source electrode 307 and the Ti/Al drain electrode 308 are formed so as to contain Ti of 50 nm and Al of 300 nm on the first undoped AlGaN layer 304 on which the SiO$_2$ thin film 305 is opened (FIG. 3C). The source electrode and the drain electrode are simultaneously formed by, for example, the photolithography process and a lift-off method using electron-beam evaporation. After the Ti/Al source electrode 307 and the Ti/Al drain electrode 308 are formed, an opening is formed on the SiO$_2$ thin film 305, the first undoped AlGaN layer 304 exposed through the opening is etched and selectively reduced in thickness, and the recessed portion is formed on the first undoped AlGaN layer 304 (FIG. 3D). The recessed structure is formed by selectively removing the SiO$_2$ thin film 305 by, for example, the photolithography process and wet etching using hydrofluoric acid, and the first undoped AlGaN layer 304 is selectively reduced in thickness to 12 nm by inductive coupled plasma (ICP) etching using Cl$_2$ gas. After the recessed structure is formed, the ZnInSnO gate electrode 309 is formed in contact with the recessed portion of the first undoped AlGaN layer 304 (FIG. 3E). In order to form the ZnInSnO gate electrode 309, the resist is patterned using photolithography, a ZnInSnO film is formed with a thickness of 200 nm by, for example, electron-beam evaporation, and the gate electrode is formed by the lift-off method. According to the field effect transistor of the present embodiment, it is possible to perform a normally-off operation with a low on resistance and a large current between the source and the drain.

Embodiment 2

Figure 4:
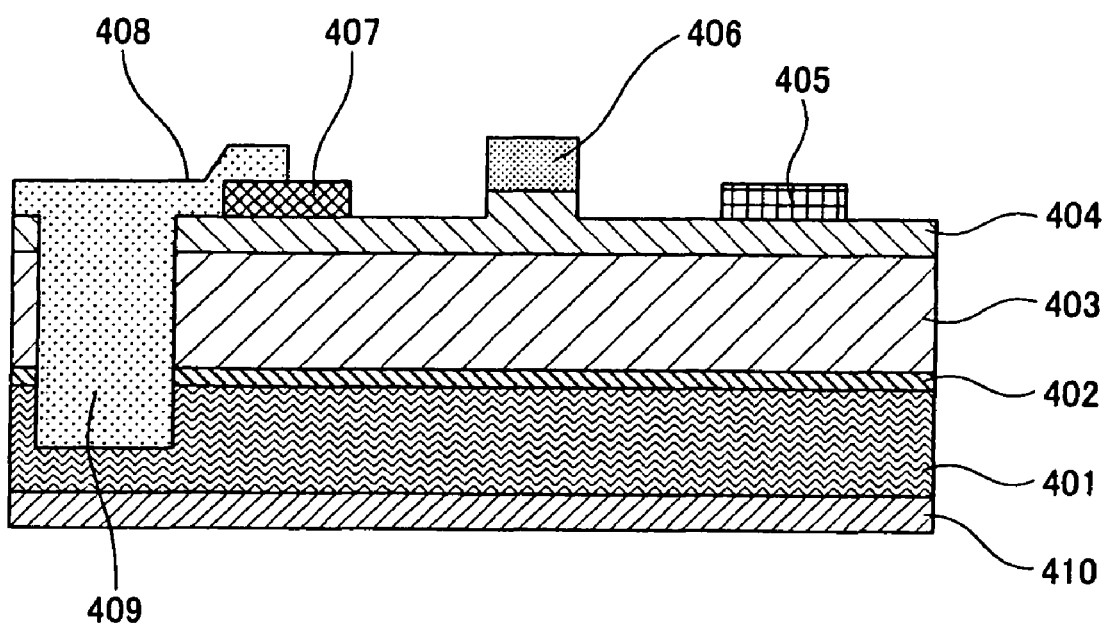
FIG. 4 is a sectional view showing a field effect transistor using a conductive oxide for a gate electrode according to Embodiment 2 of the present invention.
Figure 5A:
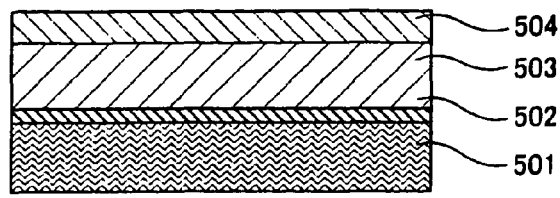
FIG. 5A is a process sectional view showing the fabrication method of the field effect transistor according to Embodiment 2 of the present invention.
Figure 5B:
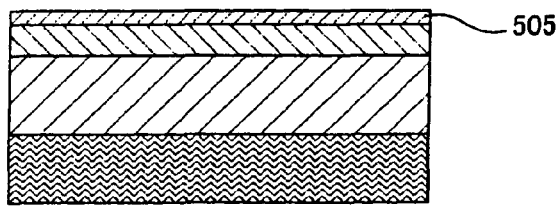
FIG. 5B is a process sectional view showing the fabrication method of the field effect transistor according to Embodiment 2 of the present invention.
Figure 5C:
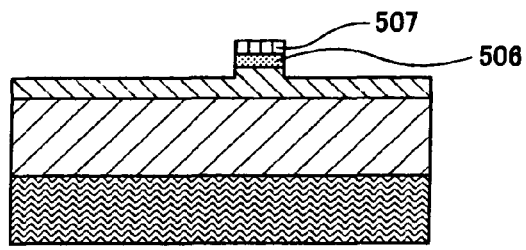
FIG. 5C is a process sectional view showing the fabrication method of the field effect transistor according to Embodiment 2 of the present invention.
Figure 5D:
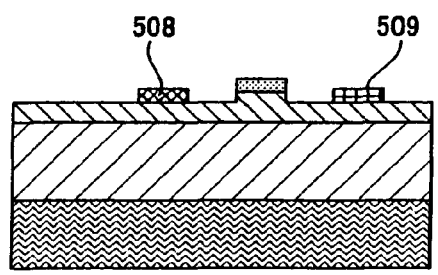
FIG. 5D is a process sectional view showing the fabrication method of the field effect transistor according to Embodiment 2 of the present invention.
Figure 5E:
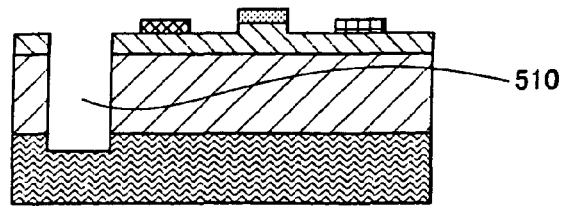
FIG. 5E is a process sectional view showing the fabrication method of the field effect transistor according to Embodiment 2 of the present invention.
Figure 5F:
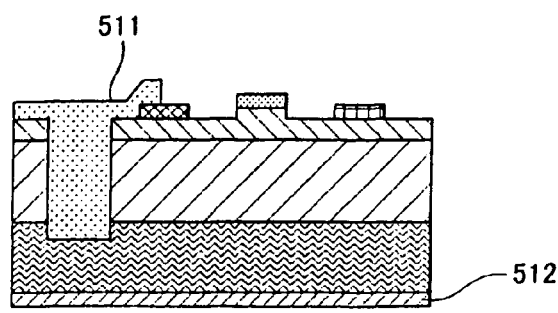
FIG. 5F is a process sectional view showing the fabrication method of the field effect transistor according to Embodiment 2 of the present invention.

FIG. 4 is a sectional view showing a field effect transistor using a conductive oxide for a gate electrode according to Embodiment 2 of the present invention.

In FIG. 4, reference numeral 401 denotes an n-type Si substrate, reference numeral 402 denotes an AlN buffer layer, reference numeral 403 denotes a first undoped GaN layer, reference numeral 404 denotes a first undoped AlGaN layer, reference numeral 405 denotes a Ti/Al drain electrode, reference numeral 406 denotes a ZnInSnO gate electrode, reference numeral 407 denotes a Ti/Al source electrode, reference numeral 408 denotes a Au wire, reference numeral 409 denotes a via hole, and reference numeral 410 denotes an Al backside source electrode.

FIG. 4 shows the configuration of the field effect transistor using the ZnInSnO gate electrode 406 according to Embodiment 2. In this configuration, the AlN buffer layer 402 having a thickness of 200 nm, the first undoped GaN layer 403 having a thickness of 1 µm, and the first undoped AlGaN layer 404 having a composition of $Al_{0.25}Ga_{0.75}N$ are formed in this order on a plane (111) of the n-type Si substrate 401. The first undoped AlGaN layer 404 includes a convex portion. The convex portion is 12 nm in thickness and the other portions are 10 nm in thickness. In this structure, the composition ratio of the first n-type AlGaN layer 404 is $Al_{0.25}Ga_{0.75N}$. The first undoped AlGaN layer 404 may be an undoped AlGaN and n-type AlGaN layer with any composition ratio as long as excellent transistor characteristics are obtained. In this case, the thickness of the convex portion of the first undoped AlGaN layer 404 is set so as to enable a normally-off operation. The ZnInSnO gate electrode 406 is formed on the convex portion of the first undoped AlGaN layer 404 and the Ti/Al source electrode 407 and the Ti/Al drain electrode 405 are formed on portions other than the convex portion of the first undoped AlGaN layer 404. The first undoped AlGaN layer 404 includes the convex portion because when a ZnInSnO film is formed over the substrate, it is necessary to prevent Zn, In and Sn of ZnInSnO from being diffused into the first undoped AlGaN layer 404 because those materials increase the contact resistance of the source and drain and a leakage current between the gate and drain and between the gate and source. In other words, portions where Zn, In and Sn are diffused are selectively removed to form the convex portion of the undoped AlGaN layer and the source and drain electrodes are formed on the recessed portions other than the convex portion, so that the contact resistance is prevented from increasing and a leakage current is reduced. Although ZnInSnO is used for the gate electrode in this configuration, a material such as $La_{2-x}Sr_xCuO_4$ and yttrium barium copper oxygen (YBCO) may be used for the gate electrode. In order to form wiring from the Ti/Al source electrode 407 to the backside of the substrate, a hole called the via hole 409 is formed so as to penetrate the first undoped AlGaN layer 404, the first undoped GaN layer 403, and the AlN buffer layer 402 and reach the n-type Si substrate 401. Further, the Au wire 408 is formed such that the Ti/Al source electrode 407 and the n-type Si substrate 401 are in contact with each other through the via hole, and the Al backside source electrode 410 is formed on the backside of the n-type Si substrate 401. This wiring can reduce a chip area because this structure does not need an area for the source pad electrode.

Referring to FIG. 5, the following will describe an example of the fabrication method of the field effect transistor shown in FIG. 4.

FIG. 5 is a sectional view showing the fabrication method of the field effect transistor according to Embodiment 2 of the present invention.

In FIG. 5, reference numeral 501 denotes an n-type Si substrate, reference numeral 502 denotes an AlN buffer layer, reference numeral 503 denotes a first undoped GaN layer, reference numeral 504 denotes a first undoped AlGaN layer, reference numeral 505 denotes a ZnInSnO thin film, reference numeral 506 denotes a ZnInSnO gate electrode, reference numeral 507 denotes a resist, reference numeral 508 denotes a Ti/Ai source electrode, reference numeral 509 denotes a Ti/Al drain electrode, reference numeral 510 denotes a via hole, reference numeral 511 denotes a Au wire, and reference numeral 512 denotes an Al backside source electrode. In this configuration, the AlN buffer layer 502 having a thickness of 200 nm, the first undoped GaN layer 503 having a thickness of 1 µm, and the first n-type AlGaN layer 504 having a thickness of 12 nm are formed in this order on a plane (111) of the n-type Si substrate 501 by MOCVD (FIG. 5A). In this epitaxial growth, the first undoped AlGaN layer 504 is formed with a composition of $Al_{0.25}Ga_{0.75}N$. After the epitaxial growth of FIG. 5A, the ZnInSnO thin film 505 having a thickness of 100 nm is formed by RF sputtering (FIG. 5B). In this case, the ZnInSnO thin film 505 is formed by RF sputtering but may be formed by laser ablation. After the ZnInSnO thin film 505 is formed, the ZnInSnO thin film 505 is selectively removed with the resist 507 serving as a mask. In addition, using the resist 507, the convex structure of the first undoped AlGaN layer 504 is formed. In order to selectively remove the ZnInSnO thin film 505, the ZnInSnO thin film 505 is selectively removed using a photolithography process with the resist 507 and ICP etching of mixed gas of $CF_4$ gas and $O_2$ gas. In addition, the first undoped AlGaN layer having a thickness of 2 nm is selectively removed by ICP etching using $Cl_2$ gas, so that the first undoped AlGaN layer 504 is convexly formed (FIG. 5C). After the etching of the first undoped AlGaN layer 504, the Ti/Al source electrode 508 and the Ti/Al drain electrode 509 are formed so as to contain Ti of 50 nm and Al of 300 nm on portions other than the convex portion of the first undoped AlGaN layer 504 (FIG. 5D). The source electrode and the drain electrode are simultaneously formed by, for example, the photolithography process and a lift-off method using electron-beam evaporation. After the Ti/Al source electrode 508 and the Ti/Al drain electrode 509 are formed, in order to form wiring from the Ti/Al source electrode 508 to the backside of the substrate, a hole called the via hole 510 is formed so as to penetrate the first undoped AlGaN layer 504 and the first undoped GaN layer 503 and reach the n-type Si substrate 501 (FIG. 5E). The via hole 510 is formed by, for example, selectively removing the first undoped AlGaN layer 504 and the first undoped GaN layer 503 using the photolithography process and ICP etching of $Cl_2$ gas. After the via hole 510 is formed, the Al backside source electrode 512 is formed on the backside of the n-type Si substrate 501, and the Au wire 511 is formed in contact with the Ti/Al source electrode 508 and the n-type Si substrate 501 via the via hole 510 (FIG. 5F). The Al backside source electrode 512 is formed by electron-beam evaporation. The Au wire 511 is formed by the photolithography process and the lift-off method using electroplating. According to the field effect transistor of the present embodiment, a gate electrode material having a high work function makes it possible to achieve the field effect transistor of normally-off type having a low specific on-state resistance, thereby reducing the contact resistance of the source and drain and the leakage current of the gate.

As described above, as in Embodiment 1, a conductive oxide such as ZnInSnO having a high work function is used for the gate electrode, thereby achieving a normally-off operation while reducing an increase in the specific on-state resistance without reducing a sheet carrier concentration. Further, portions where Zn, In and Sn are diffused in the undoped AlGaN layer are selectively removed to form a convex portion of the undoped AlGaN layer and the gate electrode is formed on the convex portion, and the source and drain electrodes are formed on the recessed portions, so that the contact resistance of the source and drain electrodes is not increased and a leakage current is reduced.

Embodiment 3

Figure 6:
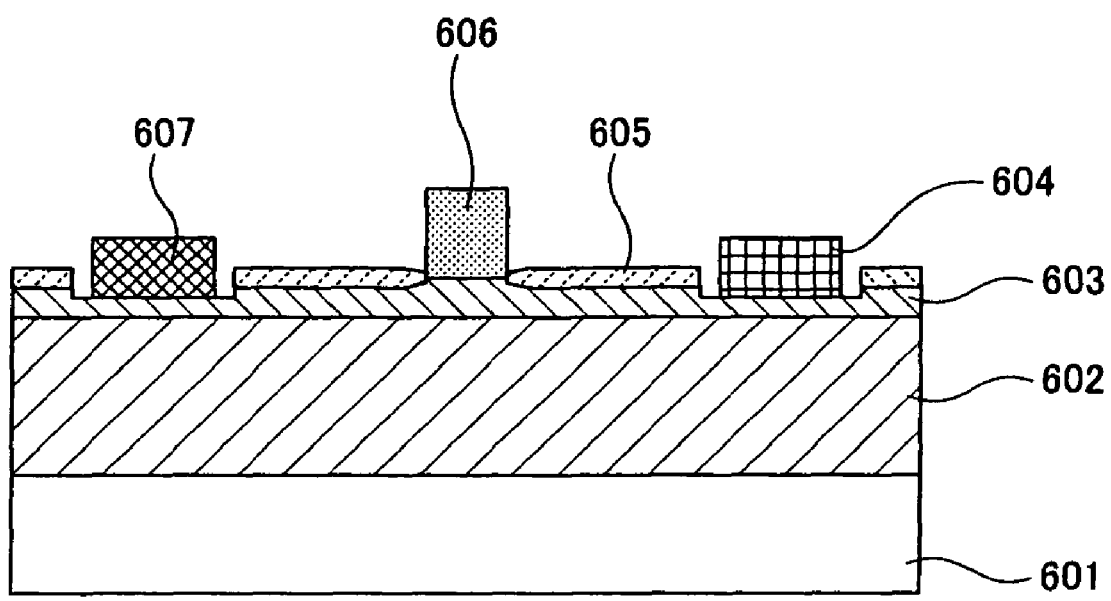
FIG. 6 is a sectional view showing a field effect transistor using a conductive oxide for a gate electrode according to Embodiment 3 of the present invention.

FIG. 6 is a sectional view showing a field effect transistor using a conductive oxide for a gate electrode according to Embodiment 3 of the present invention.

In FIG. 6, reference numeral 601 denotes a GaN substrate, reference numeral 602 denotes a first undoped GaN layer, reference numeral 603 denotes a first undoped AlGaN layer, reference numeral 604 denotes a Ti/Al drain electrode, reference numeral 605 denotes an AlGaNO$_X$-oxide layer, reference numeral 606 denotes a ZnInSnO gate electrode, and reference numeral 607 denotes a Ti/Al source electrode.

FIG. 6 shows the structure of the field effect transistor using ZnInSnO for the gate electrode according to Embodiment 3. In this structure, the first undoped GaN layer 602 having a thickness of 5 μM and the first undoped AlGaN layer having a thickness of 12 nm and are formed in this order on a plane (0001) of the GaN substrate 601. In this epitaxial layer, the composition ratio of the first undoped AlGaN layer 603 is $Al_{0.25}Ga_{0.75}N$. The first undoped AlGaN layer 603 maybe an undoped AlGaN layer and an n-type AlGaN layer with any composition ratio as long as excellent transistor characteristics are obtained. In this case, the thickness of the first undoped AlGaN layer 603 is set so as to enable a normally-off operation. The ZnInSnO gate electrode 606 and the AlGaNO$_x$ oxide layer 605 are formed on the first undoped AlGaN layer 603. When the ZnInSnO is formed over the first undoped AlGaN layer 603, Zn, In and Sn of ZnInSnO are diffused into the first undoped AlGaN layer 603. The diffused Zn, In and Sn of ZnInSnO increase the contact resistance of the source and the drain and a leakage current between the gate and drain and between the gate and source. Thus in order to make electrically ineffective the AlGaN layer where Zn, In and Sn are diffused, the AlGaNO$_x$ oxide layer 605 is formed to increase resistance. In this structure, although ZnInSnO is used for the gate electrode, a material such as $La_{2-x}Sr_xCuO_4$ and yttrium barium copper oxygen (YBCO) may be used for the gate electrode. After the AlGaNO$_X$ layer is selectively removed, the first undoped AlGaN layer 603 is exposed, and the Ti/Al source electrode 607 and the Ti/Al drain electrode 604 are formed on the exposed surface.

Referring to FIG. 7, the following will describe an example of the fabrication method of the field effect transistor shown in FIG. 6.

FIG. 7 is a process sectional view showing the fabrication method of the field effect transistor according to Embodiment 3 of the present invention.

In FIG. 7, reference numeral 701 denotes a GaN substrate, reference numeral 702 denotes a first undoped GaN layer, reference numeral 703 denotes a first undoped AlGaN layer, reference numeral 704 denotes a ZnInSnO gate electrode, reference numeral 705 denotes an AlGaNO$_X$ oxide layer, reference numeral 706 denotes a Ti/Al source electrode, and reference numeral 707 denotes a Ti/Al drain electrode.

Figure 7A:
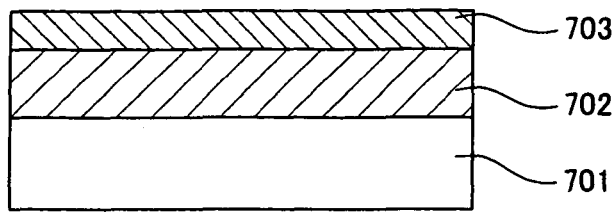
FIG. 7A is a process sectional view showing the fabrication method of the field effect transistor according to Embodiment 3 of the present invention.
Figure 7B:
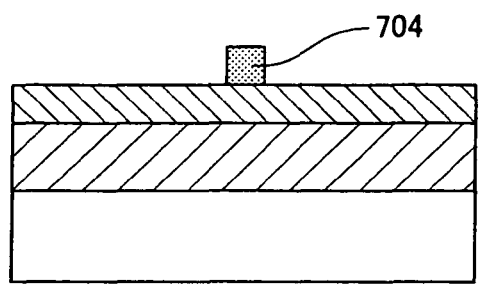
FIG. 7B is a process sectional view showing the fabrication method of the field effect transistor according to Embodiment 3 of the present invention.
Figure 7C:
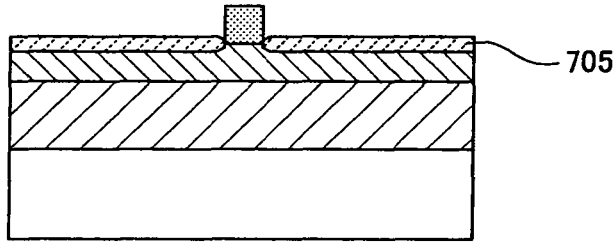
FIG. 7C is a process sectional view showing the fabrication method of the field effect transistor according to Embodiment 3 of the present invention.
Figure 7D:
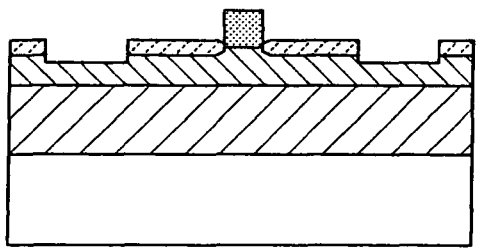
FIG. 7D is a process sectional view showing the fabrication method of the field effect transistor according to Embodiment 3 of the present invention.
Figure 7E:
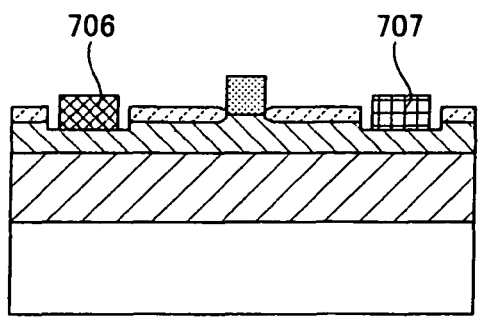
FIG. 7E is a process sectional view showing the fabrication method of the field effect transistor according to Embodiment 3 of the present invention.
Figure 8:
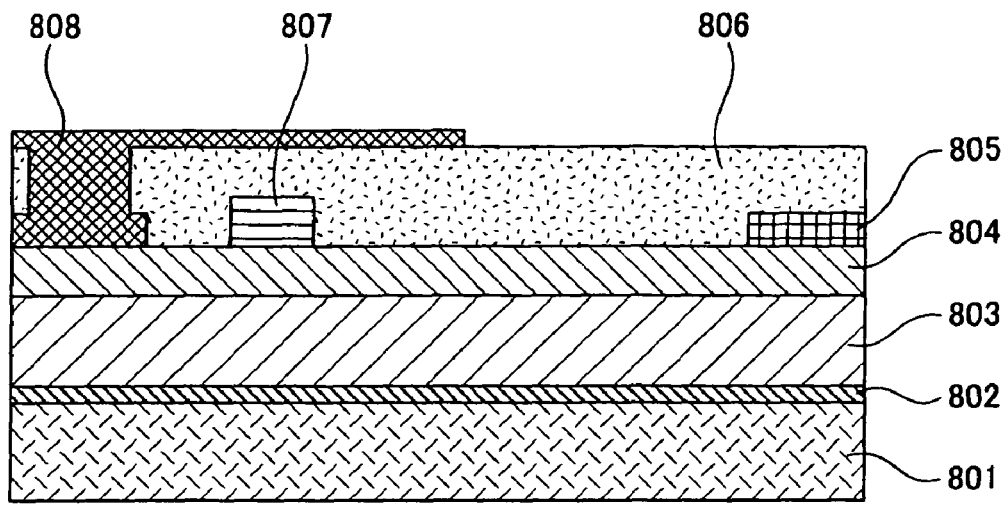
FIG. 8 is a sectional view showing the configuration of a conventional field effect transistor using a GaN semiconductor.

First, the first undoped GaN layer 702 having a thickness of 5 μm and the first n-type AlGaN layer 703 having a thickness of 12 nm are formed in this order on a plane (0001) of the GaN substrate 701 by MOCVD (FIG. 7A). In this epitaxial growth, the first undoped AlGaN layer 703 is formed with a composition of $Al_{0.25}Ga_{0.75}N$. After the epitaxial growth of FIG. 7A, the ZnInSnO gate electrode 704 is formed (FIG. 7B). The ZnInSnO gate electrode 704 is formed as follows: a ZnInSnO thin film is entirely formed by, for example, RF sputtering. In order to form the gate electrode, the ZnInSnO thin film is selectively removed by a photolithography process and ICP etching using mixed gas of $CF_4$ gas and $O_2$ gas. In this case, the ZnInSnO thin film is formed by RF sputtering but may be formed by laser ablation. After the ZnInSnO gate electrode 704 is formed, the AlGaNO$_x$ oxide layer 705 is formed (FIG. 7C). In order to form the AlGaNO$_x$ oxide layer 705, heat of about 1000° C. is applied to the first undoped AlGaN layer having a thickness of 2 nm in an atmosphere of $O_2$. Using this oxidation process, the AlGaNO$_x$ oxide layer 705 is formed. After the AlGaNO$_x$ oxide layer 705 is formed, the AlGaNO$_x$ oxide layer 705 is selectively removed on the formation areas of the source electrode and the drain electrode to expose the first undoped AlGaN layer (FIG. 7D). The first undoped AlGaN layer 703 is selectively exposed by removing the AlGaNO$_x$ oxide layer 705 using a photolithography process and ICP etching using $Cl_2$ gas. After the first undoped AlGaN layer 703 is exposed, the Ti/Al source electrode 706 and the Ti/Al drain electrode 707 are formed on the exposed first undoped AlGaN layer 703 in this order so as to contain Ti of 50 nm and Al of 300 nm (FIG. 7E). The source electrode and the drain electrode are simultaneously formed by, for example, a lift-off method using electron-beam evaporation. According to the field effect transistor of the present embodiment, a normally-off field effect transistor having a low specific on-state resistance can be realized with a gate electrode material having a high work function. In addition, this embodiment can reduce the contact resistance and the leakage current.

As described above, as in Embodiment 1, a conductive oxide such as ZnInSnO having a high work function is used for the gate electrode, thereby achieving a normally-on operation while suppressing an increase of the specific on-state resistance without reducing a sheet carrier concentration. Further, the oxidation makes nonconductive the surface of the first undoped AlGaN layer diffusing Zn, In and Sn of ZnInSnO, resulting in reducing the contact resistance of the source and drain electrodes and the leakage current.

The substrates used in the embodiments shown in FIGS. 1, 4 and 6 may have any plane direction. For example, a plane direction with an off-angle relative to a representative plane such as a plane (0001) may be used. The substrate may be made of one of GaN, SiC, ZnO, Si, GaAs, GaP, InP, $LiGaO_2$, $LiAlO_2$, and a mixed crystal thereof. The buffer layer is not limited to the AlN layer, and thus the buffer layer may be a nitride semiconductor layer of GaN or with any composition ratio as long as a preferable GaN crystal is formed on the buffer layer. The epitaxial growth layer of the field effect transistor described above may include a nitride semiconductor with any composition ratio or any multilayer structure as long as desired transistor characteristics are obtained. The crystal growth method is not limited to MOCVD and thus a layer formed by, for example, one of molecular beam epitaxy (MBE) and hydride vapor phase epitaxy (HVPE) may be included. The epitaxial growth layer may contain, as constituent elements, one of a V group element such as As and P and a III group element such as B.

Figure 9:
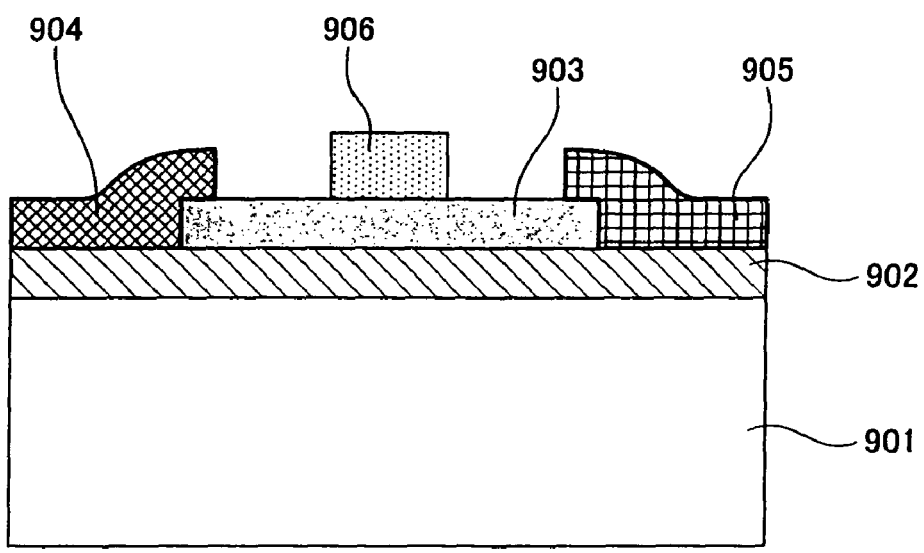
FIG. 9 is a sectional view showing the configuration of an MIS transistor using the conductive oxide of the present invention for the gate electrode.

Further, in the present embodiment, a device with an MIS structure may be used as shown in the sectional view of FIG. 9. FIG. 9 shows the structure of an MIS transistor using the conductive oxide of the present invention for the gate electrode. In this MIS structure, for example, an AlGaN layer 902 is formed on a GaN substrate 901, an insulating film 903 made of, for example, $SiO_2$ and SiN and AlN is formed on the AlGaN layer 902, and a Ti/Al source electrode 904 and a Ti/Al drain electrode 905 are formed on the AlGaN layer 902 on which the insulating film 903 is partly removed.

Further, a gate electrode 906 made of ZnInSnO is formed between the Ti/Al source electrode 904 and the Ti/Al drain electrode 905 and on the insulating film 903.

According to the MIS structure, it is possible to achieve a normally-off operation while reducing an increase in on resistance in a similar manner to the foregoing field effect transistors.

Moreover, by using $SiO_2$ for the insulating film 903 in the MIS structure, a carrier on a surface of the AlGaN layer 902 can be made ineffective, thereby reducing an increase in leakage current between the gate and drain. Instead of the insulating film 903 made of $SiO_2$, an oxide film obtained by thermal oxidation on the surface of the AlGaN layer 902 may be used.

What is claimed is:

1. A field effect transistor, comprising:
   a substrate;
   a GaN semiconductor layer above the substrate;
   an AlGaN semiconductor layer on the GaN semiconductor layer and having a recessed portion in a top surface thereof;
   an insulating film on the AlGaN semiconductor layer and having an opening therein that exposes the AlGaN semiconductor layer, the opening being located above the recessed portion;
   a gate electrode comprising a conductive oxide directly on a surface of the recessed portion of the AlGaN semiconductor layer and on a surface of the insulating film; and
   a source electrode and a drain electrode on the AlGaN semiconductor layer but apart from the recessed portion.

2. The field effect transistor according to claim 1, wherein the conductive oxide of the gate electrode has a work function of at least 5.6 eV.

3. The field effect transistor according to claim 1, wherein the conductive oxide comprises indium tin oxide containing one of Zn and Ga.

4. The field effect transistor according to claim 1, further comprising an insulating film having an opening to a semiconductor layer in contact with the gate electrode, the gate electrode covering the opening in the insulating film.

5. The field effect transistor according to claim 1, wherein the gate electrode is in contact with a surface of a semiconductor layer, and the field effect transistor further comprises an oxide layer on the surface of the semiconductor layer having no contact with the gate electrode, the oxide layer being an oxidized surface of the semiconductor layer.

6. The field effect transistor according to claim 1, wherein the insulating film is a thermal oxide film of one of $SiO_2$ and the semiconductor compound.

7. The field effect transistor of claim 1, further comprising a backside source electrode on a rear surface of the substrate.

8. The field effect transistor according to claim 1, wherein a sheet carrier concentration at a hetero junction between the GaN semiconductor layer and the AlGaN semiconductor layer is from $3.4\times10^{12}$ $(cm^{-2})$ to $6.2\times10^{-12}$ $(cm^{-2})$, and the sheet carrier concentration is located immediately below the gate electrode.

9. The field effect transistor according to claim 1, wherein the conductive oxide comprises indium tin oxide containing Ga.

10. The field effect transistor according to claim 1, wherein the conductive oxide of the gate electrode has a work function of at least 6.1 eV.

11. The field effect transistor according to claim 1, wherein the AlGaN semiconductor layer is on the c-plane of the GaN semiconductor layer.

\* \* \* \* \*